United States Patent [19]
Gunthorpe et al.

[11] Patent Number: 6,094,030
[45] Date of Patent: Jul. 25, 2000

[54] RESISTANCE AND CHARGING MONITOR WITHIN A STANDBY BATTERY BANK

[75] Inventors: Gary E. Gunthorpe; Donald E. James; Julio F. Pineda, all of Calgary, Canada

[73] Assignee: Deltatee Enterprises Ltd., Calgary, Canada

[21] Appl. No.: 09/311,123

[22] Filed: May 13, 1999

[51] Int. Cl.[7] .......................... H01M 10/44; H01M 10/46
[52] U.S. Cl. .......................... 320/116; 320/132; 324/430
[58] Field of Search ...................... 320/116, 118, 320/119, 132, 134, 135, 136, DIG. 12, DIG. 19, FOR 147; 324/434; 340/635, 636; 429/90

[56] References Cited

U.S. PATENT DOCUMENTS

| | | | |
|---|---|---|---|
| 4,423,379 | 12/1983 | Jacobs et al. | 324/429 |
| 4,484,140 | 11/1984 | Dieu | 324/434 |
| 4,614,905 | 9/1986 | Peterson et al. | 320/18 |
| 4,707,795 | 11/1987 | Alber et al. | 364/483 |
| 5,153,496 | 10/1992 | LaForge | 320/17 |
| 5,449,570 | 9/1995 | Inkmann et al. | 429/92 |
| 5,546,003 | 8/1996 | Noworolski et al. | 324/434 |
| 5,610,495 | 3/1997 | Yee et al. | 320/6 |
| 5,705,929 | 1/1998 | Caravello et al. | 324/430 |
| 5,710,503 | 1/1998 | Sideris et al. | 320/6 |

*Primary Examiner*—Edward H. Tso
*Attorney, Agent, or Firm*—Millen, White, Zelano & Branigan, P.C.

[57] ABSTRACT

Apparatus and method are provided for measuring the series resistance of each individual cell of a battery bank for establishing the readiness of the batteries. The invention comprises a switch in series with a load, connected across each cell of the battery. An electronic switch momentarily imposes the load on the cell and the value of the current drawn from the battery and the voltage across it is measured with an A/D device. A controller directs a plurality of the switched loads on a plurality of cells. The A/D device and controller on each cell communicates their measurements to a remote host computer, preferably via an RF serial modem. The host computer calculates the internal resistance and provides alarm and other reporting functions. Further, as the measurement imposes a small energy drain on the cell, through independent adjustment of the frequency of measurement for each cell, over-charging of the individually cells can be equalized.

40 Claims, 5 Drawing Sheets

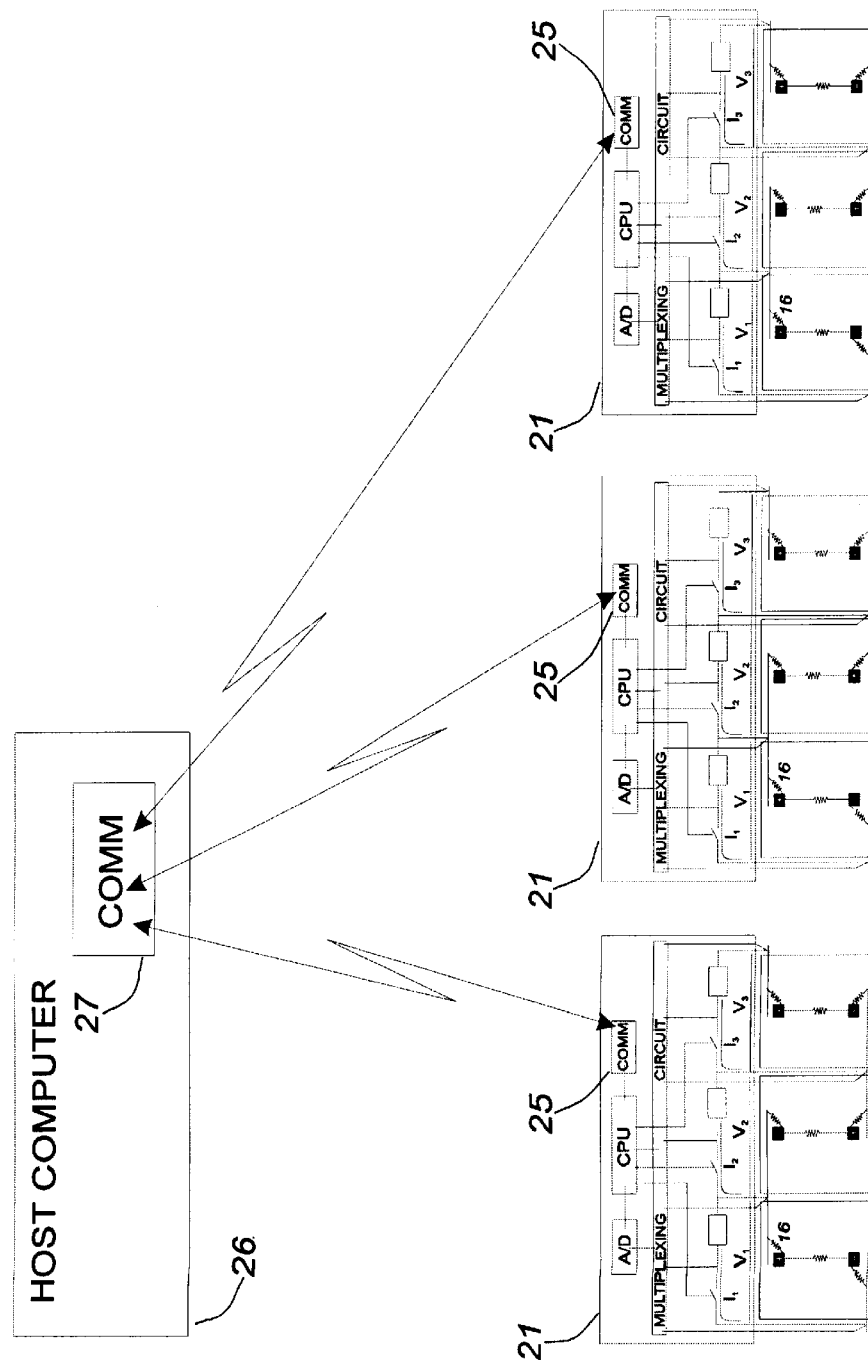

6,094,030

RESISTANCE AND CHARGING MONITOR WITHIN A STANDBY BATTERY BANK

FIELD OF THE INVENTION

The present invention relates to apparatus and method for monitoring a battery and in particular for determining the internal and connection resistances for each cell in a standby battery bank, while the battery bank remains connected to the system. Further, the invention enables equalization of the charge for individual cells in a battery bank.

BACKGROUND OF THE INVENTION

A standby battery bank is an electrical system which comprises enough individual cells connected in series or series parallel to supply the required voltage and current for its designed load. It is known that, after long periods of time on standby charge, when the battery bank is finally called upon to provide the energy for the load, the battery bank may not be capable of performing as designed. The most common cause of battery failure is due to increased internal resistance of the cell itself, such as from chemistry degradation, or due to the resistance of the connections to it. With respect to the connections, corrosion often develops between bus bars and terminals interconnecting the cells as a result of the presence of strong acid vapors. When load is applied, the resulting high current causes a voltage drop across all the resistances which reduces the output voltage of the battery bank.

For example, if the connection resistance becomes 0.01 $\Omega$ and 1000 amperes are drawn, then a 10 V drop occurs, and about 10 KW of heat is generated thus causing the cell to overheat. On a 48V system then, unacceptably, only 38V remain available for use. Degradation in cell chemistry can be even more serious. If, for example, internal resistance increases to 1 $\Omega$, then a 48 V system is unable to sustain a 1000 ampere draw at all and the output voltage is caused to fall to zero.

Accordingly, to avoid suffering a system failure, just when the standby batteries are most needed, several methods currently exist to identify a cell having high resistance.

One such method involves removing the entire bank from standby duty and replacing it with a temporary substitute. A known load, similarly sized as a substitute for the designed load, is placed across the battery bank and the voltage across each cell is measured. Ohm's law (V=IR) is then used to calculate the resistance between each cell. This calculated resistance is the sum of the resistance of the connections and the internal resistance of the cell itself. This process is expensive, requires installation of heavy wires across dangerously high voltages in a corrosive environment, and are prone to cause problems with the battery bank.

Other methods include imposing a large load across the entire battery bank while it continues to charge. Individual cell voltages are then multiplexed to a single measurement instrument. For example, in U.S. Pat. No. 5,705,929 to May 23, 1995 to Caravello et al., a test is disclosed for applying a large, high-current-capable load across the entire battery bank. Long wires extend from each cell to be multiplexed onto a measurement instrument located centrally to the battery bank. The Carvello approach requires many long wires and the installation of large, expensive, heat-generating resistors and power switches. Further, due to the large drain imposed and maintained on the battery bank, it is significantly discharged during the test.

In another typical characteristic of standby battery banks, because a plurality of individual cells are connected in series, each cell receives the same amount of charging current. Therefore, the float charging current is typically set to a value required by the most needy individual cell. As a result, some cells tend to be over-charged.

Proposals to correct this over-charging have been made. In U.S. Pat. No. 4,614,905 filed Sep. 30, 1986 by Petersson et al, over-charging is controlled by imposing a varying load across each cell in the bank. Petersson discloses connecting a transistor across each cell so that a small amount of current is dynamically bypassed around each cell, dependent on the cell's voltage—its state of charge. Unfortunately, this method does not contemplate measuring the cell's overall resistance and further, it imposes a constant float current which, if flowing for long extended periods, tends to degrade the life of the cell.

As discussed above, applicants are not aware of prior art which adequately address the problems in reliably measuring the resistances of individual cells of a battery bank. Therefore, there is a demonstrated need for means which allow individual cell resistances to be frequently and safely measured, while the battery bank is still in the system, in use, or while charging. Preferably, the resistance measurement is accomplished without discharging the cells, and further provides means to equalize individual cells without imposing a constant current for extended periods of time.

SUMMARY OF THE INVENTION

Generally, without taking the battery bank out of service, there is provided apparatus and method for determining the resistance across an individual cell by automatically and momentarily imposing a current limiting device across a cell in a battery bank for a period of time, in the order of a few milliseconds. An electronically-controlled switch is used to switch the current limiting device across the cell, causing current to flow out of the cell. The resulting momentary current flow through the circuit and the voltage drop across the cell are measured over the short time for determination of the cell's overall connection resistance and its internal resistance. Preferably, using a micro-computer, a plurality of the aforementioned electronically-switched loads can be directed to impose individual loads and measure the resultant voltage drop across a plurality of individual cells. Further, as each measurement voltage is associated with a current flow, the frequency at which the measurement is independently performed for a cell can offset overcharging of individual cells.

Therefore, in one broad apparatus aspect of the invention, a resistance monitor is provided for measuring the resistance across an individual cell among a plurality cells for a battery designed to deliver a design current, the cells being connected in series, the monitor comprising:

a first circuit having a load having resistance which, if shorted across a cell produces a current flow less than the design current, the load preferably being a resistor;

an electronic switch for momentarily connecting, then removing the resistive load across an individual cell, the switch preferably being a transistor device;

a second circuit for measuring voltage drop across the cell when connected by the switch;

means for measuring the current flow through the load; and a controller for actuating the electronic switch.

The apparatus enables practice of a novel method of determining the resistive status of an individual cell, the method comprising:

electronically actuating a switch in a circuit for momentarily connecting a load and inducing the flow of current through an individual cell; and measuring the voltage drop across the cell; and measuring the current in the circuit.

Preferably the method is applied to a plurality of individual cells of a bank of cells wherein each of a plurality of electronically switches are actuated for momentarily connecting a load across each individual cell and measuring the resultant voltage drop across the cell.

The apparatus further lends itself to a novel method of equalizing the charging of individual cells in a bank of cells, comprising:

determining the state of charge of the cell;

electronically actuating a switch for momentarily connecting a load across an individual cell for drawing a small current;

determining the amount of charge removed from the cell; and repeating the momentary connection of the load across the individual cell for removing energy therefrom and at a frequency suitable to compensate for overcharging of the cell, preferably using a controller which automatically actuates the switch as a function of the state of charge of the cell.

BRIEF DESCRIPTION OF THE DRAWINGS

FIG. 5 is a schematic which illustrates a plurality of micro-computers, each controlling the switching of a plurality of cells, the micro-computers being in communication and controlled by a host computer.

DETAILED DESCRIPTION OF THE PREFERRED EMBODIMENT

Figure 1:
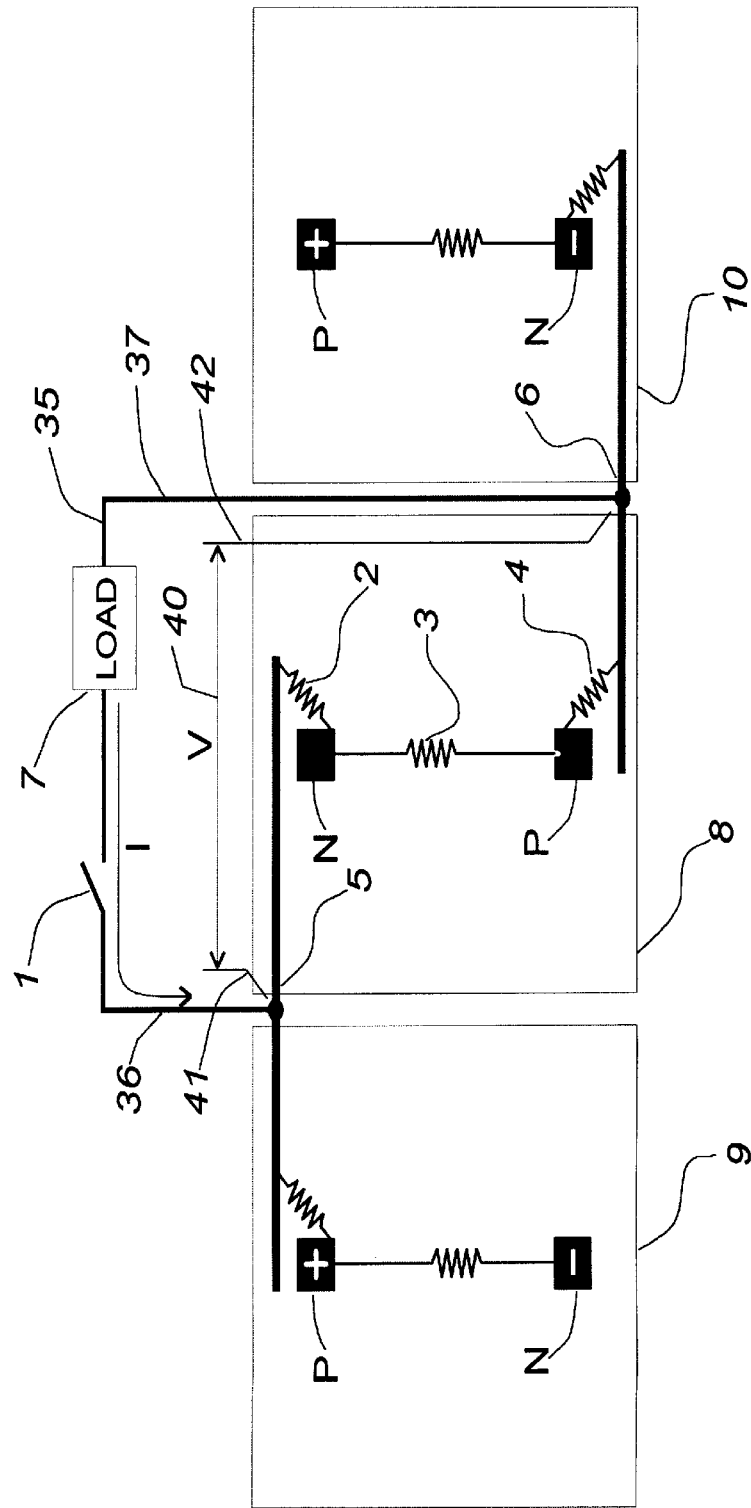
FIG. 1 is a schematic depicting one embodiment of the present invention in which a current limiting device is switched across an individual battery cell.

Referring to FIG. 1 there is illustrated a system for momentarily switching a load 7 across one individual cell 8 of a plurality of battery cells 9,8,10 which together make up a standby battery bank. Each individual cell has a positive battery terminal P and a negative terminal N. Other than end cells in the bank, an individual cell 8 is connected by bus bar 5 from its negative terminal N to the positive terminal P of the first adjacent cell 9 and connected by bus bar 6 from its positive terminal P to the negative terminal N of the second adjacent cell 10.

A trickle charging circuit (not shown) is applied across the bank of cells for providing a float charge. It is known that the trickle charge is chosen to ensure the most needy cell, or cell having the greatest self-discharge, is satisfied. As a result, the voltage of individual cells in a bank of cells can vary.

The individual cell's internal resistance is represented by resistance 3, and connection resistances at the negative and positive terminals N,P are represented by resistances 2,4 respectively.

A load circuit 35 is provided comprising a pair of current leads 36,37, one to each of bus bars 5,6 respectively. An electronic switch 1 and a current-limiting device or load 7 are serially positioned in the circuit 35 between the current leads 36,37. When actuated to close, switch 1 connects load 7 across the bus bars 5,6. Unlike known conventional testing apparatus, load 7 has a relatively high resistance and draws a relatively small current when shorted across the cell 8, the magnitude being less than that of the designed load. The current draw across load 7, for a normally 1000 ampere service, could be in the order of 70 amps, dependent upon the current rating of the load 7.

A voltage-measuring circuit 40 is provided comprising a pair of sense leads 41,42, one sense lead to each of bus bars 5,6 respectively. By placing the sense leads 41,42 directly to the bus bars 5,6, error associated with a voltage drop across the current leads 36,37 is avoided.

In operation, switch 1 is first actuated to close, causing current I to flow out of the cell 8, through current leads 36,37, load 7 and back to the cell. The switch 1 is only closed for a short time before being actuated to open again, specifically, between time $T_0$ and $T_1$. The duration between $T_0$ and $T_1$ is in the order of 500 to 1000 millisecond. By measuring the voltage across a resistive load 7, the current I through the circuit is determined. If the resistive value of the load 7 is not known the current can be determined with Hall Effect sensors.

The voltage measured across the cell 8, through the sense leads 41,42, immediately drops by voltage V. The voltage is indicative of current I times the sum of the resistances of: the connection resistance 2 (bus bar 5 to the negative terminal N); the internal cell resistance 3; and the connection resistance 4 (positive terminal P to bus bar 6). The resistances are unknown and are determined using the cell voltage $V_{cell}$ and the current I in the circuit 35.

Due to the short duration of current flow, the continuous current rating of load 7 could be somewhat less than the expected current flow 1, there being only a short time available to overheat.

Figure 2:
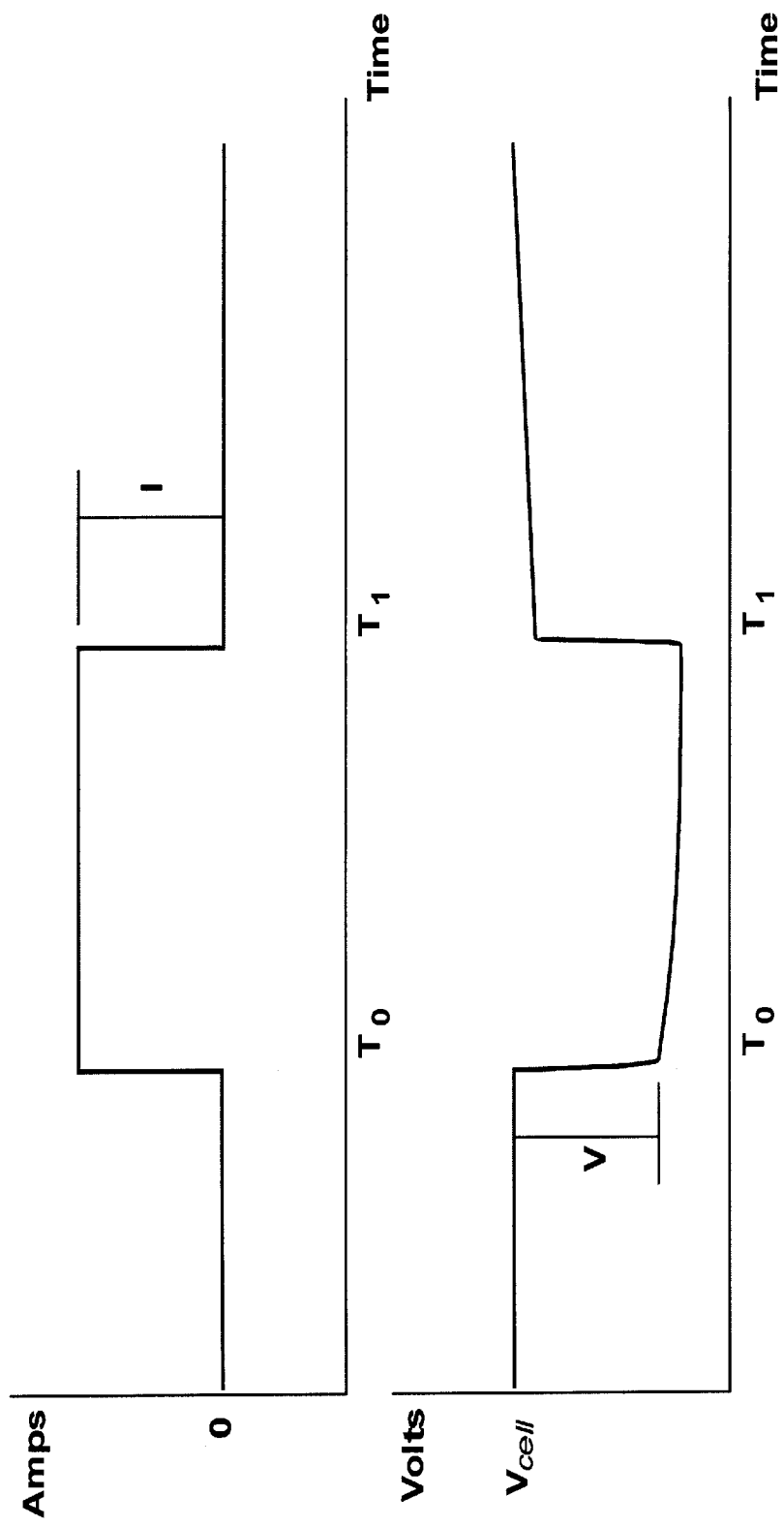
FIG. 2 illustrates current and voltage wave forms which result for an individual battery cell measured for one cycle according to FIG. 1.

Referring to FIG. 2 the chart illustrates current I drawn from a single cell 8 starting at time $T_0$ when the switch 1 is closed. The resulting current I is the difference between the current passing through the load imposed on the cell and the float charging current. The cell voltage $V_{cell}$ immediately drops at time $T_0$, by an amount V, equal to the current I times the sum of the connection resistances 2,4 and the internal resistance of the cell 3. The cell voltage $V_{cell}$ continues slowly decrease as energy is removed from the cell until the switch opens and current I is removed at time $T_1$.

At time $T_1$, when the switch 1 is opened, the cell voltage $V_{cell}$ immediately increases again by V, the same amount as it fell, due to the fact that there is no longer any current I flowing out of the cell and thus passing through the resistances. The cell voltage again slowly rises as the float charge current replaces any energy removed by the novel measurement process.

It is noted that the immediate voltage drop V and the continued voltage drop between $T_0$ and $T_1$ is characteristic of the cell 8 and its health.

Surprisingly, in applying the apparatus and method of the present invention, it has been determined that there is not a need to place a large, high-current capable load for a sustained period across the cells for determining the bank's readiness.

Figure 3:
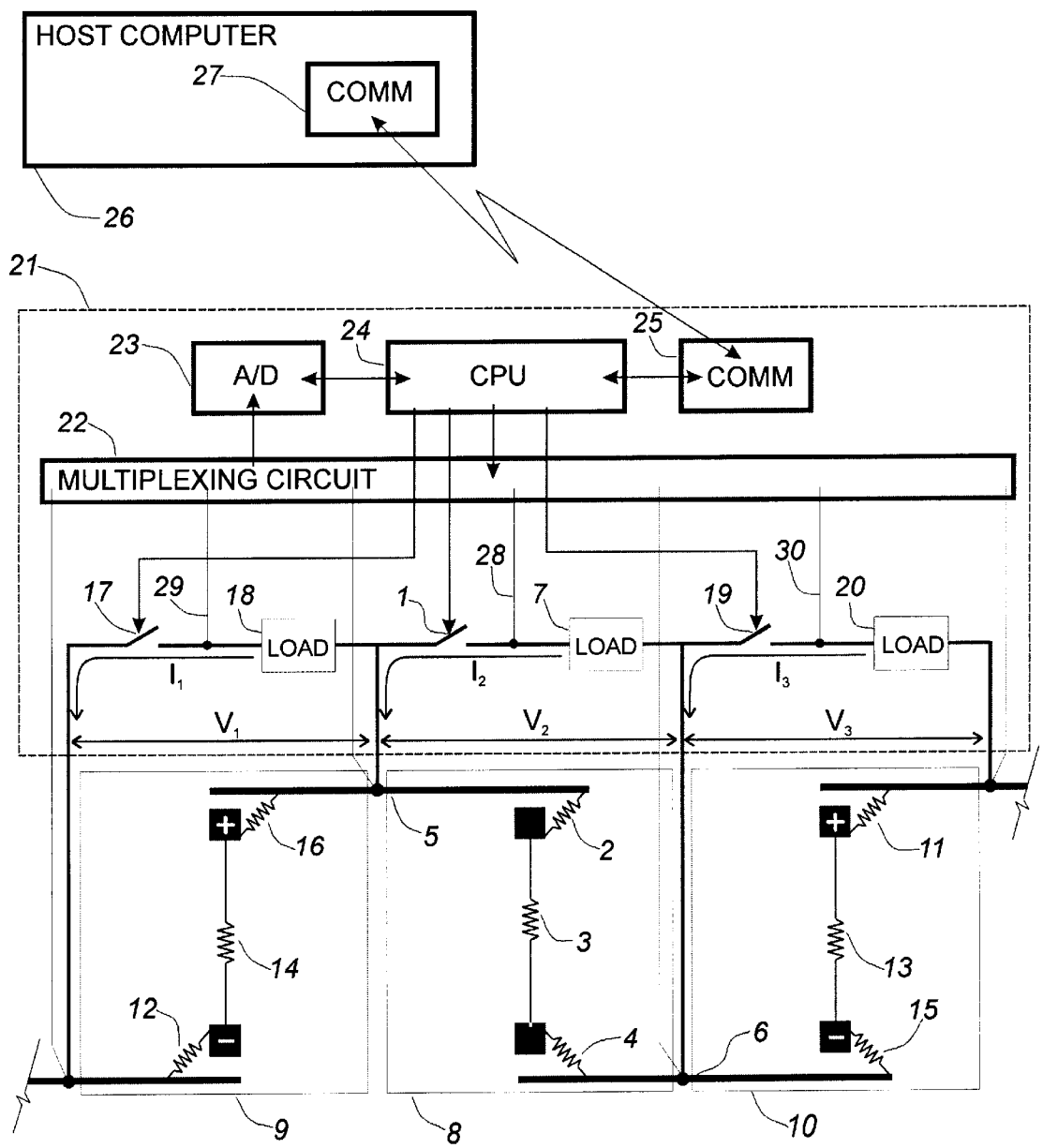
FIG. 3 is a schematic depicting a micro-computer which electronically controls the switching of a load across a plurality of cells, using a load of known resistance. The micro-computer communicates with a host computer.

Applying the principles above, and having reference to FIG. 3, there is illustrated a system for controlling current switches 17,1,19, loads 18,7,20, and sensing circuits 40 of a plurality of cells 8, 9 &10. A plurality of voltage-measuring circuits 40 are provided comprising pairs of sense leads 29,42 and 42,53 and 53,54 across each of cells 9,8,10 respectively.

A controller 21 is positioned adjacent to the cells. The sensing leads 41,42 are routed to a multiplexing circuit 22 at the controller. Controller 21 is controlled and communicates with a host computer 26 via a serial radio modems 27,25.

The above arrangement permits the use of short sensing and current leads which are easy to install and reduce the possibility of electrical shorts.

Internally the controller 21 consists of a micro-computer 24 which separately controls a plurality of switches 17,1,19. The switches 17,1,19 are electronically actuated transistors, such as a FET or MOSFET device. When closed, each switch causes a known load 18,7,20 to be individually and momentarily connected, each through its current leads 36,37 across its respective cell 9,8,20 of the battery bank. An example of a known load 7 is a low value resistor.

Then, through a multiplexing circuit 22, the micro-computer 24 can individually connect the various voltage sense leads 41,42 and current sense leads 50,29 to an analog to digital (A/D) converter 23.

Using a two channel A/D (not detailed), both cell voltage and circuit current can be measured simultaneously. Alternatively, a single channel, high speed A/D can also be used.

The resulting digital data is then stored by the micro-computer 24 and communicated via corresponding serial radio frequency devices or modems 25 and 27 to the host 26 computer.

The host computer 26 logs and records the measurement data collected from each remote controller 21 and reports current, voltage, cell charge state or any alarm conditions, such as high cell resistance, to a manned center.

Taking the center cell 8 as an example, micro-computer 24 automatically closes switch 1 thus placing load 7 across bus bars 5 & 6. The resulting voltage $V_2$ measured across sense leads 41,42 is then multiplexed onto the A/D 23. Current $I_2$ is simultaneously measured by multiplexing the voltage measured across the known load 7 onto the A/D 23 by connecting the sense line 51 sense line 28 between the switch 1 and load 7 to the A/D 23. The current I is then calculated by the micro-computer 24 using Ohm's law (V=IR) where V is the measured voltage and R is the resistance of the known load 7. The micro-computer 24 then opens switch 1 after a fixed delay and measures the cell voltage $V_2$ as it rises.

In the simplest embodiment, the micro-computer 24 directs that this process be repeated on each cell 9,8,10 connected to the controller 21, for measuring the respective internal and contact resistances 16,14,12 or 2,3,4 or 11,13, 15. The host computer 26 determined and adjusts the required parameters for each cell 9,8,10 as necessary.

In another embodiment, the measurement process can be used to manage cell charging and prevent cell over-charging. The resistance measurement apparatus and process draws a known current and thus a known charge or energy from each cell in a battery bank, for a period of time in the order of a few milliseconds. This process is repeated at a frequency which causes sufficient energy to be removed from the cell to equalize the charge for that cell in a bank cells which are normally unevenly charged.

Each micro-computer 24 adjusts the frequency at which the respective switch 17,1,19 is closed and each cell 9,8,10 is measured. As the cell is measured, it is loaded and energy removed. The cell's own voltage itself can provide the micro-computer 24 with the means to determine the state of the cell's charge. By adjusting the frequency at which the cells 9,8,10 are measured, sufficient energy is removed from the individual cell to equalize the float charge on that cell.

The micro-computer 24 calculates the state of the cell and determines the amount of current required to be drawn from the cell. A frequency of switching occurrence is then calculated and used to control the switch. Optionally, the host computer can calculate and instruct the micro-computers for adjusting the measurement frequency for each cell.

For example, if one cell is typically overcharged at 0.2 Amp-hour/hour, then at 70 amps for 1 second per measurement, then the measurement would be performed 10 times per hour to equalize the charge for that cell.

Figure 4:
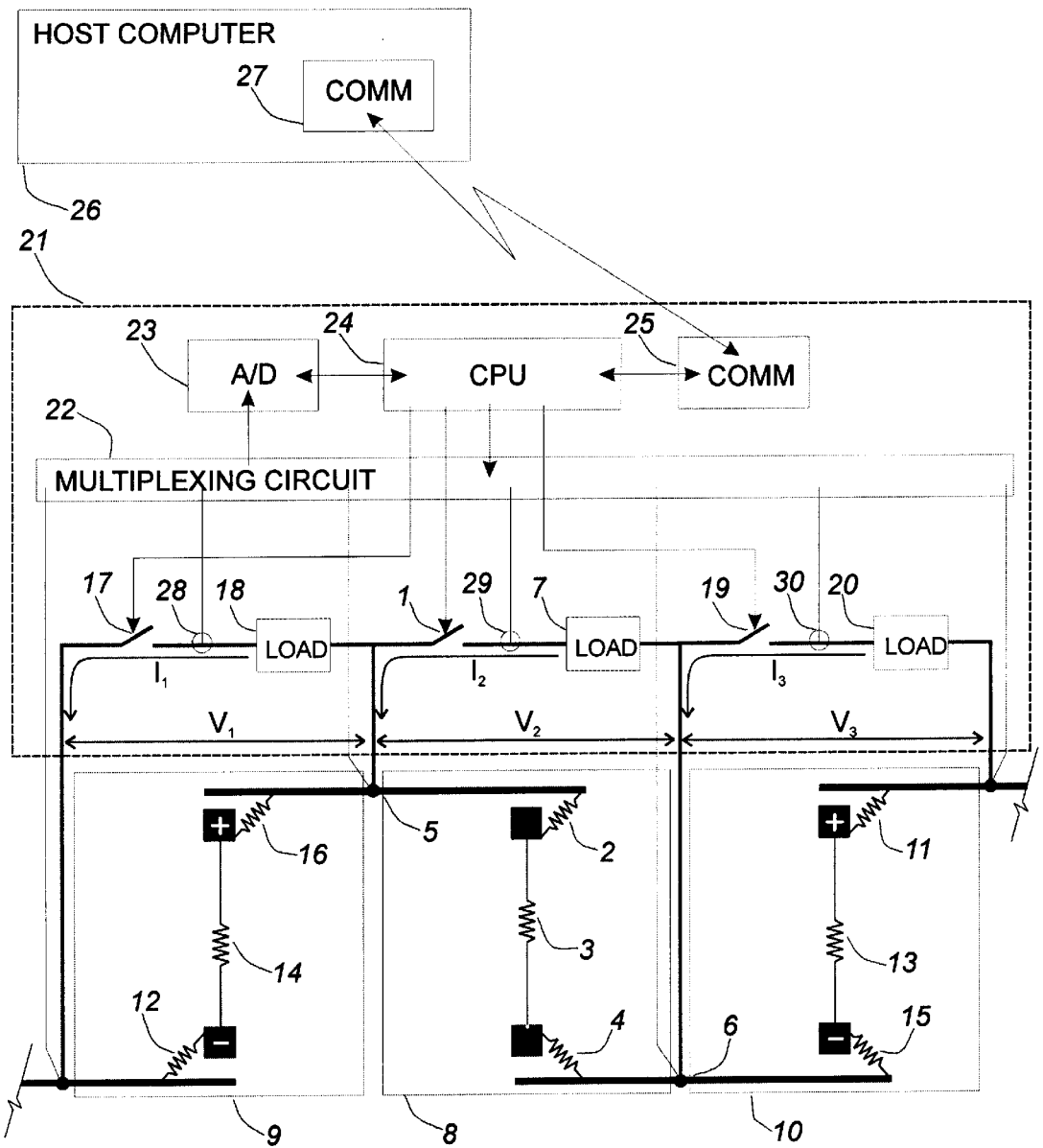
FIG. 4 is a schematic according to FIG. 3, wherein the circuitry uses an unknown resistor or non-linear device as the load and a current sensor.

Referring to FIG. 4, the known load 7 or loads 18,7,20 as shown in FIG. 3, are replaced with an unknown load 18,7,20. This is the case where an isolating or blocking diode may be inserted to replace the known load, the diode preventing current feed back if any cell fails open circuit. A diode is a non-linear load and determination of the current I is performed using a Hall Effect device 29,28,30 or the like.

As shown in FIGS. 3 and 4, it can be seen that a single micro-computer 24 controls a plurality of switches 17,1,19 and measurement circuits 30,40. Thus one micro-computer 24 can manage a plurality of cells 9,8,10. Further, a single host computer 26 can also control a multiplicity of micro-computers 24.

Referring to FIG. 5 there is illustrated a system for controlling a multiplicity of controllers 21 with one host computer 26. The host computer 26 addresses each controller 21 individually. An address is attached to each command sent via the radio modem 25. Each radio modem 25 in each controller 21, continuously listens for its address. Only the controller 21 with the correct address responds.

The embodiments of the invention in which an exclusive property or privilege is claimed are defined as follows:

1. Apparatus for periodically and momentarily measuring the electrical resistance across each of two or more individual cells connected in series comprising:

two or more circuits, each circuit connected across an individual cell and having a load and a switch connected in series, each switch being operable between open and closed positions for alternately opening and closing the circuit for connecting the circuit's load across the circuit's individual cell respectively;

means for momentarily operating each circuit's switch between the open and closed positions so that, when the circuit's switch is in the closed position, current flows through the circuit's load and through the circuit's individual cell;

means for measuring the current flowing through each circuit; and means for measuring the voltage across each individual cell when current is flowing through its respective circuit so that the individual cell's electrical resistance is determinable using Ohm's law.

2. The cell resistance measuring apparatus as recited in claim 1 wherein the switch is a transistor.

3. The cell resistance measuring apparatus as recited in claim 2 wherein:

the load is a resistor of known resistance; and the current sensor is a sensor for measuring voltage across the known resistance of the resistor in the circuit.

4. The cell resistance measuring apparatus as recited in claim 2 wherein:
the load is of unknown resistance; and
the current sensor is a hall effect sensor for measuring current through the circuit.

5. The cell resistance measuring apparatus as recited in claim 2 wherein the means for momentarily operating a circuit's switch between the open and closed positions is a controller for actuating the transistor.

6. The cell resistance measuring apparatus as recited in claim 5 wherein controller is a micro-computer.

7. The cell resistance measuring apparatus as recited in claim 6 further comprising:
a host-computer; and
means for digital communication between the micro-computer and the host-computer.

8. The cell resistance measuring apparatus as recited in claim 7 wherein the means for communicating between the micro-computer and the host-computer is a modem.

9. The cell resistance measuring apparatus as recited in claim 5 wherein the means for measuring the individual cell's voltage and circuit current are provided for each individual cell, their respective measurements being multiplexed to the controller.

10. The cell resistance measuring apparatus as recited in claim 5 further comprising:
means for sequentially measuring the voltage and circuit current for each individual cell; and
one or more A/D converters for processing the measured voltage and circuit current for the controller.

11. The cell resistance measuring apparatus as recited in claim 10 wherein the sequential measurement means is a multiplexer controlled by the controller.

12. The cell resistance measuring apparatus as recited in claim 5 wherein the means for measuring the current through each circuit and the means for measuring the voltage across each cell individual are multiplexed to one or more A/D converters controlled by the controller.

13. The resistance measuring apparatus as recited in claim 5 further comprising:
means for determining the state of charge of each individual cell; and
means for determining the energy removed each cells circuit when connected so that the controller operates the switch for a higher charged individual cell at a higher frequency than that employed for other cells so as to draw more energy from the higher charged cell and thereby equalize the charge between individual cells.

14. The resistance measuring apparatus as recited in claim 13 wherein the micro-computer determines the frequency at which to operate each individual cell's switch using the measured circuit current, cell voltage and elapsed time the switch remains in the closed position.

15. A method for determining the individual resistances of each of a plurality of battery cells comprising:
forming a circuit across each individual cell, each circuit having an electrical load and a switch in series;
selecting a circuit;
momentarily closing the switch in the selected circuit for passing current from the individual cell and through the load in the selected circuit;
measuring the current through the selected circuit;
measuring the voltage across the individual cell in the selected circuit so that measures of the resistance of the individual cell in the selected circuit can be established using the measured current and measured voltage;
opening the switch in the selected circuit; and
repeating the preceding steps for all cells.

16. The method as recited in claim 15 wherein the switch is a transistor.

17. The method as recited in claim 16 wherein a controller electronically opens and closes the switch.

18. The method as recited in claim 16 wherein a controller selects a circuit and electronically opens and closes the switch in the selected circuit.

19. The method as recited in claim 18 further comprising multiplexing the current and voltage measurements for the plurality cells to an A/D converter.

20. The method as recited in claim 19 further comprising:
establishing the state of overcharge of the individual cell in the selected circuit;
determining a frequency at which the momentary load can be introduced through the circuit to the individual cell so as to eliminate an overcharged state; and
momentarily closing the switch for the selected circuit at the determined frequency.

21. The method as recited in claim 20 wherein a micro-computer determines the switching frequency.

22. The method as recited in claim 21 further comprising communicating individual cell measurements to a host computer.

23. The method as recited in claim 22 wherein the individual cell measurements are communicated to the host computer via wireless transmission.

24. The method as recited in claim 23 wherein the wireless communication is accomplished with a serial radio modem.

25. Apparatus for periodically and momentarily measuring the electrical resistance across each of two or more individual cells connected in series comprising:
two or more circuits, each circuit connected across an individual cell and having a load and a transistor connected in series, each transistor being operable between open and closed positions for alternately opening its circuit and closing its circuit for connecting each load solely across each individual cell respectively;
a controller for momentarily operating each circuit's transistor between the open and closed positions so that, when the transistor is in the closed position, current flows through the load and through the individual cell; and
means for measuring the current flowing solely through each circuit; and
means for measuring the voltage solely across each individual cell when current is flowing through its respective circuit so that the cell's electrical resistance is determinable using Ohm's law.

26. The cell resistance measuring apparatus as recited in claim 25 wherein the controller is a micro-computer.

27. The cell resistance measuring apparatus as recited in claim 26 further comprising:
a host-computer; and
means for digital communication between the micro-computer and the host-computer.

28. The cell resistance measuring apparatus as recited in claim 27 wherein the means for communicating between the micro-computer and the host-computer is a modem.

29. The cell resistance measuring apparatus as recited in claim 26 wherein the means for measuring the individual cell's voltage and circuit current are provided for each individual cell, their respective measurements being multiplexed to the micro-computer.

30. The cell resistance measuring apparatus as recited in claim 26 further comprising:

means for sequentially measuring the voltage and circuit current for each individual cell; and one or more A/D converters for processing the measured voltage and circuit current for the micro-computer.

31. The cell resistance measuring apparatus as recited in claim 30 wherein the sequential measurement means is a multiplexer controlled by the micro-computer.

32. The cell resistance measuring apparatus as recited in claim 26 wherein the means for measuring the current through each circuit and the means for measuring the voltage across each cell individual are multiplexed to one or more A/D converters controlled by the micro-computer.

33. The resistance measuring apparatus as recited in claim 26 further comprising:

means for determining the state of charge of each individual cell; and means for determining the energy removed each cells circuit when connected so that the micro-computer operates the switch for a higher charged individual cell at a higher frequency than that employed for other cells so as to draw more energy from the higher charged cell and thereby equalize the charge between individual cells.

34. The resistance measuring apparatus as recited in claim 33 wherein the micro-computer determines the frequency at which to operate each individual cell's switch using the measured circuit current, cell voltage and elapsed time the switch remains in the closed position.

35. A method for determining the individual resistances of each of a plurality of battery cells comprising:

forming a circuit across each individual cell, each circuit having an electrical load and a switch transistor in series;

selecting a circuit using a controller;

opening and closing the switch using the controller;

momentarily closing the switch in the selected circuit for passing current from the individual cell and through the load in the selected circuit;

measuring the current through the selected circuit;

measuring the voltage across the individual cell in the selected circuit so that measures of the resistance of the individual cell in the selected circuit can be established using the measured current and measured voltage;

opening the switch in the selected circuit; and multiplexing the current and voltage measurements for the plurality cells to an A/D converter.

36. The method as recited in claim 35 further comprising:

establishing the state of overcharge of the individual cell in the selected circuit;

determining a frequency at which the momentary load can be introduced through the selected circuit so as to eliminate an overcharged state of the individual cell; and momentarily closing the switch for the selected circuit at the determined frequency.

37. The method as recited in claim 36 wherein a micro-computer determines the switching frequency.

38. The method as recited in claim 37 further comprising communicating individual cell measurements to a host computer.

39. The method as recited in claim 38 wherein the individual cell measurements are communicated to the host computer via wireless transmission.

40. The method as recited in claim 39 wherein the wireless communication is accomplished with a serial radio modem.

* * * * *